Aug. 14, 1962 L. W. BERNI 3,049,687

PLUG-IN VARIABLE RESISTOR

Filed Aug. 26, 1959 2 Sheets-Sheet 1

INVENTOR

Louis Berni,

BY Paris Haskell & Levine

ATTORNEYS

Aug. 14, 1962 L. W. BERNI 3,049,687

PLUG-IN VARIABLE RESISTOR

Filed Aug. 26, 1959 2 Sheets-Sheet 2

INVENTOR

Louis Berni

BY Paris, Haskell & Levine

ATTORNEYS

United States Patent Office 3,049,687

Patented Aug. 14, 1962

3,049,687

PLUG-IN VARIABLE RESISTOR

Louis W. Berni, East Boston, Mass., assignor to Ace Electronics Associates, Inc., a corporation of Massachusetts Filed Aug. 26, 1959, Ser. No. 836,153
1 Claim. (Cl. 338—183)

The present invention relates to variable resistors, potentiometers, or rheostats, and particularly to plug-in forms of such devices which may, for example, be employed as interchangeable and replaceable units in printed circuit boards.

In many printed circuit devices, a network of conductors is usually printed, stamped, etched or otherwise applied to the surface of an insulating base plate. These conductors are the leads whereby various electrical and electronic components of the circuit are interconnected. For example, these leads may interconnect in appropriate circuit relationship a plurality of vacuum tubes, resistors, inductors, capacitors, and potentiometers. Although some of the foregoing elements can be formed by printing techniques directly as part of the printed circuit, others cannot. And in any event, in some embodiments, it is preferred that the printed circuit provide only the interconnecting leads, and that the elements all be standard separate components replaceably connected into the printed circuit. In many such embodiments, the circuit board is provided with appropriate plug receptacles for receiving the elements of the circuit as plug-in units, and the printed leads interconnect the receptacle elements. The present invention relates to potentiometers and rheostats of the plug-in variety, particularly adapted for although not limited to use in the above-indicated plug-in type printed circuit boards.

In one common variety of precision potentiometers, the resistance element is formed as a wire wound resistance card, which is inserted within a housing along with a mechanism for moving a slider or contact tap over the resistor. Obviously, the resistance card, or any other type resistance element that may be employed, must be suitably anchored within the housing, and numerous conventional modes for effecting this are well known in the art. Also, of course, means must be provided for bringing the necessary potentiometer leads out of the housing. For plug-in units, it is a conventional approach to provide the housing with plug prongs which project outside the housing, and have a portion which extends into the housing. These prongs may, for example, be molded integrally with the housing. The resistance card and variable tap mechanism are then mounted within the housing in any conventional manner, and the necessary potentiometer connections are made internally of the housing to the plug prongs by running lead wires from the ends of the resistance wire and the variable tap device to the respective plug prongs. Since the plug-in potentiometer units employed with printed circuits are frequently miniature units, this feeding and soldering or welding of leads internally of the housing can be very difficult and arduous, and require a substantial amount of time of skilled personnel.

In accordance with the present invention, however, it has been found that since the plug prongs are necessarily present in plug-in units, the prongs themselves can advantageously be used as the means for fixing the resistance cards in place, and at the same time, the mechanical connection of the prongs with the resistance cards can function to provide directly the necessary electrical connections therebetween. In this manner, not only may the potentiometer units be manufactured more efficiently and economically, but a more reliable unit is obtained in that two internal leads and their attendant solder or weld joints are eliminated.

Accordingly, one object of the present invention is to provide a plug-in potentiometer or rheostat.

Another object of the present invention is to provide a plug-in potentiometer or rheostat wherein the plug prongs function to anchor the resistance element in place relative to the casing.

Still another object of the present invention is to provide a plug-in potentiometer or rheostat wherein the plug prongs function to anchor the resistance element in place relative to the casing, and wherein the mechanical anchoring junction also provides electrical connection between the resistance element and the anchoring plug prongs.

Other objects and advantages of the present invention will become apparent to those skilled in the art from a consideration of the following detailed description of one exemplary specific embodiment of the invention, had in conjunction with the accompanying drawings, in which like numerals refer to like or corresponding parts, and wherein.

Figure 7A:
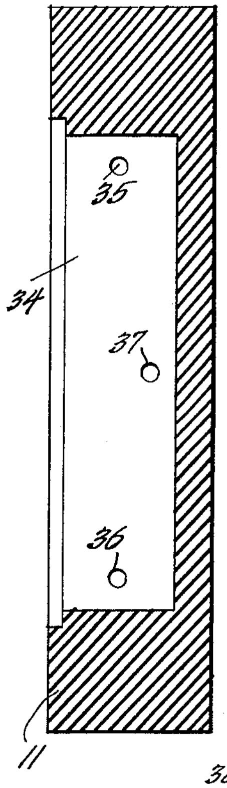
Figure 7B:
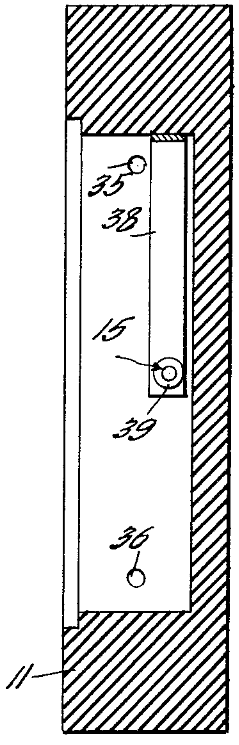
Figure 7C:
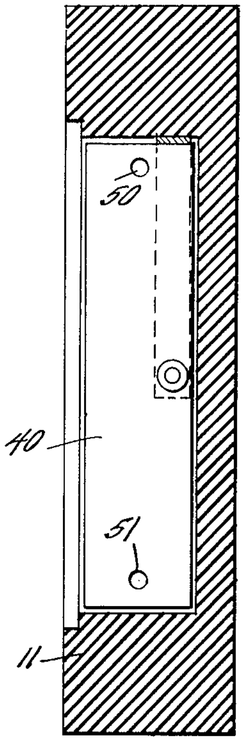
Figure 7D:
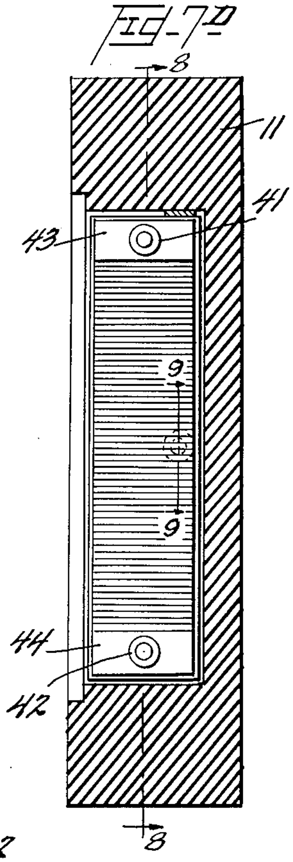
Figure 8:
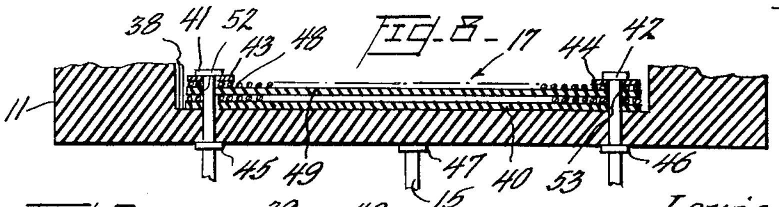

FIGS. 7A–D are face views of the inside bottom surface of the unit and its casing, with the side walls shown in section, illustrating the progressive assembly of elements to the bottom of casing;

FIG. 8 is a longitudinal sectional view taken along line 8—8 of FIG. 7D; and

Figure 9:
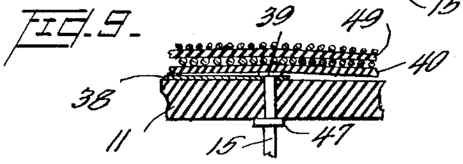

FIG. 9 is a fragmentary sectional view taken on line 9—9 of FIG. 7D.

Referring to the drawings, the present invention is illustrated as embodied in a rectilinear variable potentiometer. The casing 10 for this potentiometer comprises a housing 11 open on one side and there adapted to receive a cover plate 12. The housing and cover plate may preferably be formed of molded plastic or other electrically insulating material. After the internal parts of the potentiometer are assembled within the housing 11, the cover plate 12 may be cemented in place on its recessed seat 12*a* to provide a sealed casing for the unit. Electrical contact with the internal parts of the potentiometer is effected through the plug prongs 13, 14 and 15, depending from the bottom of the housing 11, as will be more fully described subsequently.

Figures 1, 2:
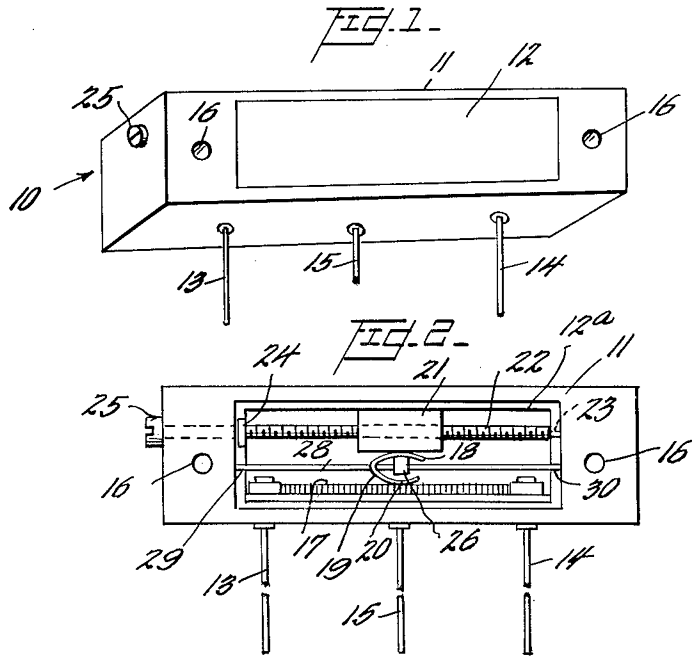
FIG. 1 is an exterior isometric view of a potentiometer embodying the principles of the present invention.
FIG. 2 is a side elevation view of the unit shown in FIG. 1, with the panel 12 removed.
Figure 3:
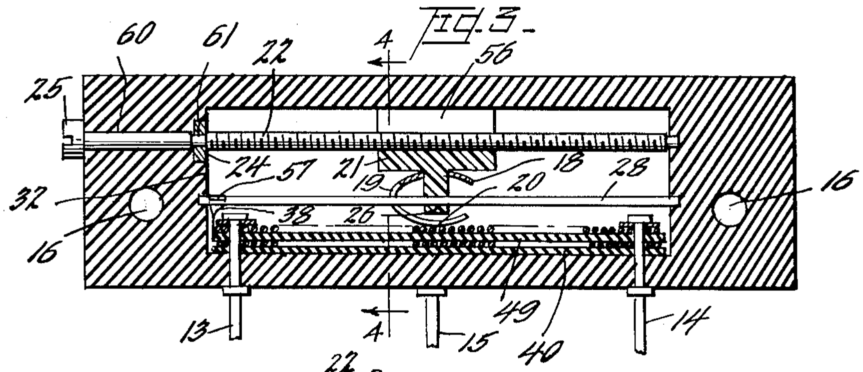
FIG. 3 is a longitudinal vertical section through the unit shown in FIG. 1.
Figure 4:
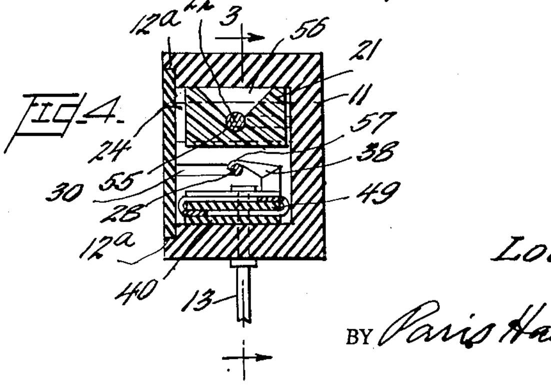
FIG. 4 is a cross sectional view taken along line 4—4 of FIG. 3.
Figure 6:
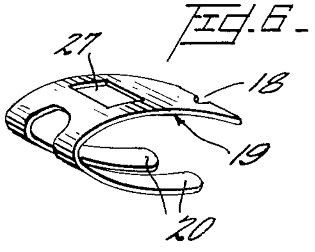

The general organization of the instant rectilinear potentiometer is best shown in FIGS. 2, 3 and 4, FIG. 2 being an elevational side view of the unit with the cover plate 12 removed, FIG. 3 being a vertical longitudinal section through the center of the unit, and FIG. 4 being a cross sectional view of the unit. A wire-wound resistance card generally indicated by the numeral 17 is located adjacent the bottom of the housing 11. A lead screw 22 carrying a traveler block 21 is located opposite the resistance card 17 adjacent the top of the housing 11. The traveler block 21 is in threaded engagement with the lead screw for movement longitudinally of the housing by rotation of the screw. This block 21 is stabilized against rotational movement with the lead screw by engagement of its top surface with the top of the housing, and also by means of the depending tab 26, which has an aperture 54 in which rod 28 is received for slidable movement of the tab thereon. A spring metal tap member 19, shown in perspective view in FIG. 6, is mounted on the tab 26 by means of aperture 27. Tap 19 has resilient bifurcated contact fingers 20 straddling the rod 28 and in pressure engagement with the wire wound resistor 17, and has at its opposite end a contact portion 18 riding in pressure engagement with the rod 28. Rod 28 thus functions as an electrical bus for current tapped from the resistor 17 by movable tap member 19. As will be subsequently explained in greater detail, plug prongs 13 and 14 are electrically connected with the ends of the wire wound resistor 17, and plug prong 15 is electrically connected to the rod or bus 28. Thus, with the application of an electric potential between plug prongs 13 and 14, a desired fraction thereof may be tapped through plug prong 15 by adjustment of the position of the traveler block 21 and the tap member 19 carried thereby.

Figure 5:
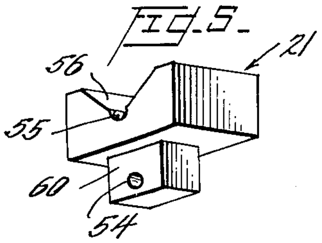
FIGS. 5 and 6 are enlarged perspective views of elements employed in the unit of FIG. 1.

Considering in greater detail the assembly of the lead screw, traveler block, and bus rod, it will be observed that the lead screw 22 is axially insertable into the housing 11 through the end aperture 60 in end wall 32 of the housing 11. A reduced diameter end 23 of the lead screw is received in an appropriate recess therefor formed in the opposite end wall 33 of the housing. Between the head 25 of the lead screw and its threaded run, a reduced diameter or necked portion 61 is provided for reception of a C type locking bearing 24. The locking bearing 24 may also be slightly sprung to induce an axial thrust on the lead screw and bring its head 25 into firm seating engagement with the end of the housing 11, thus stabilizing the lead screw against axial play. The traveler block 21 is preferably formed of a tough resilient material, such as Teflon, and as best shown in FIG. 5, has a circumferentially interrupted bore 55, which is threaded to mate with the lead screw 22. Additionally, the block 21 has a wedge-shaped cut-out 56 of sufficient depth to result in the aforementioned circumferential interruption of the bore 55. The circumferential interruption of bore 55 is chosen to be less than 180°, and thus the traveler block 21 is retained on and caused to respond to the lead screw 22. At the same time if the lead screw is rotated to place the traveler block at either end of its traverse, continued rotation of the lead screw will not jam the block, because the resiliency of the block material and the wedge-shaped cut-out 56 enable the block to expand sufficiently to ride over the threads of the lead screw and then return into engagement with the threads. The bus rod 28 is simply an electrically conducting rod, and is seated in the housing 11 by means of corresponding slots 29 and 30 formed in each end wall 32, 33 of the housing, to permit the sliding reception and frictional retention of the bus rod therein.

The assembly of the resistance card 17 and the plug prongs 13, 14, and 15 is best shown in FIGS. 7A–D, 8, and 9. FIGS. 7A–D are transverse sections of the housing 11, showing a plan view of the inside bottom surface 34 thereof, and the progressive positioning of the various elements mounted thereon. The bottom 34 of the housing 11 is provided with three appropriately spaced apertures 35, 36, and 37. A conductive ribbon 38 is located on the surface 34. Plug prong 15 having a preformed shoulder 47 is inserted through aperture 37 in the bottom of the housing and through a corresponding aperture in the conductive ribbon 38, until said shoulder 47 is in abutting engagement with the bottom of the housing. The head of the plug prong 15 protruding into the housing and through the conductive ribbon 38 is then swaged or peened at 39 to firmly clamp the conductive ribbon 38 to the bottom 34 of the housing. An insulating plate 40, which may be a flexible plastic sheet, is applied over the bottom surface 34 and the conductive ribbon 38, except that a portion of the ribbon is fed upwardly along end wall 32 of the housing beyond the edge of plate 40, and soldered or welded at 57 to an end of the bus rod 28 (see FIGS. 3 and 4). The assembly is now ready for the insertion of resistance card 17. In the preferred embodiment, card 17 comprises an insulation strip or base 49, having resistance wire 48 helically wound thereon in conventional fashion, and having the terminal end caps 43 and 44 mounted over the resistance wire and secured to the card 17 adjacent the ends thereof. Card 17 is provided with end apertures 52, 53 providing openings through caps 43, 44, wire 48, and base 49; and the card is positioned in the housing 11 with the end apertures 52, 53 in registry with the apertures 50, 51 in the insulation plate 40, which in turn are in registry with the holes 35 and 36 in the bottom of the housing. Plug prongs 13 and 14 are inserted from the outside of the housing through all the respective corresponding apertures until their preformed shoulders 45 and 46 are in engagement with the bottom of the housing. The heads of these plug prongs projecting into the housing 11 are then swaged or peened at 41 and 42 to secure and clamp the resistance card 17 and insulation plate 40 in position within the housing 11. Through end or terminal caps 43 and 44 and the swaged heads 41 and 42, plug prongs 13 and 14 provide electrical contact with their respective ends of the wire wound resistance card 17. The potentiometer electrical circuit is completed by plug prong 15 making electrical contact with the conductive ribbon 38 through its swaged head 39, ribbon 38 in turn making connection with the bus rod 28 and thus with tap member 19, which places the plug prong 15 in electrical circuit with the variable tap of the potentiometer.

Particularly with respect to plug prongs 13 and 14, it will be appreciated from the foregoing description that these elements provide a dual function. They provide both the means whereby electrical contact is established with the ends of the wire wound resistance card 17, and at the same time they function to anchor the card in fixed and invariable position upon the bottom surface 34 of the housing 11, the anchoring means being the very means by which said electrical contact is had.

The foregoing specific embodiment of the present invention provides a plug-in rectilinear variable resistor, potentiometer, or rheostat, wherein the plug prongs function to anchor the resistance card in place within the housing of the unit and the mechanical anchoring structure provides direct electrical contact between the prongs and the resistance element. It is understood that the foregoing specific embodiment of the invention is presented merely as an illustration to enable a complete understanding thereof, and it is not intended that the scope of the invention shall be considered as limited to the details of this embodiment. For example, other means than that illustrated may be employed for effecting a linear movement of the wiper tap member 19; also, the principles of the invention may be applied to rotary potentiometers as well as rectilinear devices, all as will be readily apparent to those skilled in the art. Other variations and modifications will be apparent to those skilled in the art, and accordingly, such as are embraced by the spirit and scope of the appended claim are contemplated as within the purview of the present invention.

What is claimed is:

A plug-in rectilinear variable resistor comprising: a housing; an elongate rectilinearly extending resistance element in said housing positioned along one wall thereof; a variable tap mechanism in said housing including a slide contact element engaging said resistance element, a traveler block carrying said contact element, and a lead screw engaging said block for moving said contact element rectilinearly over the length of said resistance element for tapping various resistance values therefrom; a variable tap lead coupled to said contact element and including a terminal portion sandwiched between said resistance element and said one wall of said housing, and a bus rod portion mounted over said resistance element, extending substantially parallel thereto, being connected to said terminal portion, and being slidably engaged by said contact element; a first plug prong projecting exteriorly of said housing and entering said housing through said one wall and having an end portion passing through said terminal portion of said lead, said end portion being deformed to provide a head anchoring said terminal portion between said head and said one wall and making electrical contact therewith; an insulator sandwiched between said terminal portion and resistance element separating said terminal portion and plug prong from said resistance element; second and third plug prongs projecting exteriorly of said housing entering said housing through said one wall and each having end portions passing through respective terminal portions of said resistance element, said end portions of said second and third plug prongs each being deformed to provide a head anchoring the respective terminal portion of said resistance element between such head and said one wall and making electrical contact therewith; and a shoulder on each of said three plug prongs located adjacent the exterior of said one wall; whereby the strains of both insertion and removal of said plug prongs from a socket adapted to receive them is applied to said one wall of said housing, and said plug prongs also serve to anchor and establish electrical contact with said resistance element and said variable tap lead.

References Cited in the file of this patent

UNITED STATES PATENTS

| | | |
|---|---|---|
| 1,154,626 | Hadaway | Sept. 28, 1915 |
| 1,929,446 | Ogg | Oct. 10, 1933 |
| 2,898,569 | Royce | Aug. 4, 1959 |
| 2,938,186 | Kassay et al. | May 24, 1960 |

FOREIGN PATENTS

| | | |
|---|---|---|
| 564,541 | France | Oct. 20, 1923 |
| 796,931 | Great Britain | June 25, 1958 |